(12) United States Patent
Choi (10) Patent No.: US 12,200,971 B2
(45) Date of Patent: Jan. 14, 2025

(54) DISPLAY DEVICE

(71) Applicant: Samsung Display Co., LTD., Yongin-si (KR)

(72) Inventor: Kyung Hyun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 544 days.

(21) Appl. No.: 17/590,478

(22) Filed: Feb. 1, 2022

(65) Prior Publication Data

US 2022/0246689 A1 Aug. 4, 2022

(30) Foreign Application Priority Data

Feb. 2, 2021 (KR) .................. 10-2021-0014893

(51) Int. Cl.
*H10K 59/126* (2023.01)
*H10K 59/121* (2023.01)
*H10K 59/131* (2023.01)
*H10K 59/65* (2023.01)

(52) U.S. Cl.
CPC ......... *H10K 59/121* (2023.02); *H10K 59/126* (2023.02); *H10K 59/131* (2023.02); *H10K 59/65* (2023.02)

(58) Field of Classification Search
None
See application file for complete search history.

(56) References Cited

U.S. PATENT DOCUMENTS

| | | | | |
|---|---|---|---|---|
| 2021/0328199 A1* | 10/2021 | Yao | ....... | H10K 50/865 |
| 2022/0123062 A1* | 4/2022 | Cho | ....... | H10K 59/65 |
| 2024/0224704 A1* | 7/2024 | Choi | ....... | H10K 59/50 |

FOREIGN PATENT DOCUMENTS

| | | |
|---|---|---|
| KR | 10-1084245 | 11/2011 |
| KR | 10-2017-0088013 | 8/2017 |
| KR | 10-2017-0104097 | 9/2017 |
| KR | 10-2020-0008081 | 1/2020 |

* cited by examiner

*Primary Examiner* — Benjamin P Sandvik
(74) *Attorney, Agent, or Firm* — KILE PARK REED & HOUTTEMAN PLLC (57) ABSTRACT

A display device includes a substrate including a first display area and a second display area, first pixels disposed on the substrate in the first display area, a functional module disposed below the substrate in the second display area, and a light block layer disposed on the functional module. The light block layer includes patterns disposed in a matrix in the second display area. The second display area includes a transmission area as an area in the second display area not including the light block layer. Each of the patterns include a main part having a substantially rectangular shape with substantially rounded corners and line parts substantially curved away from the main part.

20 Claims, 9 Drawing Sheets

DISPLAY DEVICE

CROSS-REFERENCE TO RELATED APPLICATION(S)

This application claims priority to and benefits of Korean Patent Application No. 10-2021-0014893 under 35 U.S.C. § 119, filed on Feb. 2, 2021 in the Korean Intellectual Property Office, the entire contents of which are incorporated herein by reference.

BACKGROUND

1. Technical Field

Embodiments described herein relate to a display device. Embodiments described herein relate to a display device including a functional module that receives external light.

2. Description of the Related Art

A display device may include pixels emitting light. The pixels may be disposed in a display area of the display device. Accordingly, in the display area, the display device may display an image by combining light emitted from the pixels.

The display device may include a functional module having various functions. The functional module may receive external light incident from outside of the display device. Accordingly, the functional module may take a picture or an image, or may recognize a user's motion (for example, the movement of an iris).

The functional module may be disposed in the display area of the display device. A pixel may not be disposed in an area where the functional module is disposed in the display area. Accordingly, since an image may not be displayed in an area where the functional module is disposed, a problem in which a size of the display area is relatively small may occur.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including a functional module, and having a relatively large size of a display area.

A display device may include a substrate including a first display area and a second display area; first pixels disposed on the substrate in the first display area; a functional module disposed below the substrate in the second display area; and a light block layer disposed on the functional module. The light block layer may include patterns disposed in a matrix in the second display area. The second display area may include a transmission area as an area in the second display area not including the light block layer. Each of the patterns may include a main part having a substantially rectangular shape with substantially rounded corners and line parts substantially curved away from the main part.

According to an embodiment, the line parts may include a first line part adjacent to a first side of the main part; a second line part adjacent to a second side opposite to the first side of the main part; a third line part adjacent to a third side disposed between the first side and the second side of the main part; and a fourth line part adjacent to a fourth side opposite to the third side of the main part.

According to an embodiment, a first curvature radius of the first line part, a second curvature radius of the second line part, a third curvature radius of the third line part, and a fourth curvature radius of the fourth line part may be equal to each other.

According to an embodiment, each of a first curvature radius of the first line part, a second curvature radius of the second line part, a third curvature radius of the third line part, and a fourth curvature radius of the fourth line part may be about 25 μm or more and about 30 μm or less.

According to an embodiment, each of a width of the first line part, a width of the second line part, a width of the third line part, and a width of the fourth line part may be about 15 μm or more and about 30 μm or less.

According to an embodiment, each of the line parts may include a protrusion on a side surface of the line parts.

According to an embodiment, the display device may further include a second pixel disposed on the main part; and a wiring disposed on the line part, the wiring part may be electrically connected to the second pixel.

According to an embodiment, the wiring may include at least one of a gate signal line, a data signal line, and a driving signal line.

According to an embodiment, the wiring may include conductive layers sequentially stacked on the line parts. Each of the conductive layers may be electrically insulated from each other.

According to an embodiment, a curvature radius of the substantially rounded corners of the main part may be about 15 μm or more and about 30 μm or less.

A display device may include a substrate including a first display area and a second display area; first pixels disposed on the substrate in the first display area; a functional module disposed below the substrate in the second display area; and a light block layer disposed on the functional module. The light block layer may include patterns disposed in a matrix in the second display area. The second display area may include a transmission area as an area in the second display area not including the light block layer. Each of the patterns may include a main part having a substantially rectangular shape and including a substantially circular protrusion part at corners of the substantially rectangular shape; and line parts substantially curved away from the main part.

According to an embodiment, the line parts may include a first line part adjacent to a first side of the main part; a second line part adjacent to a second side opposite to the first side of the main part; a third line part adjacent to a third side disposed between the first side and the second side of the main part; and a fourth line part adjacent to a fourth side opposite to the third side of the main part.

According to an embodiment, a first curvature radius of the first line part, a second curvature radius of the second line part, a third curvature radius of the third line part, and a fourth curvature radius of the fourth line part may be equal to each other.

According to an embodiment, each of a first curvature radius of the first line part, a second curvature radius of the second line part, a third curvature radius of the third line part, and a fourth curvature radius of the fourth line part may be about 25 μm or more and about 30 μm or less.

According to an embodiment, each of a width of the first line part, a width of the second line part, a width of the third line part, and a width of the fourth line part may be about 15 µm or more and about 30 µm or less.

According to an embodiment, each of the line parts may include a protrusion on a side surface of the line parts.

According to an embodiment, the display device may further include a second pixel disposed on the main part; and a wiring disposed on the line part, and electrically connected to the second pixel.

According to an embodiment, the wiring may include at least one of a gate signal line, a data signal line, and a driving signal line.

According to an embodiment, the wiring may include conductive layers sequentially stacked on the line part. Each of the conductive layers may be electrically insulated from each other.

According to an embodiment, a curvature radius of the substantially circular protrusion part of the main part may be about 15 µm or more and about 30 µm or less.

In the display device of the disclosure, the light block layer disposed on the functional module may include the main part and the line parts bent in the direction away from the main part. The display device of the disclosure may include substantially curved line parts and the main part with substantially rounded corners. Accordingly, diffraction of external light incident to the functional module from the outside of the display device may be relatively small.

The display device of the disclosure may include a transmission area defined as an area in the second display area in which the light block layer does not exist, and external light incident to the functional module from the outside of the display device may be incident on the functional module through the transmission area. The line part defining a partial boundary of the transmission area may be bent in the direction away from the main part. Accordingly, transmittance of external light incident to the functional module from the outside of the display device may be relatively large.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the disclosure. In the drawings.

DETAILED DESCRIPTION OF THE EMBODIMENTS

Illustrative, non-limiting embodiments will be more clearly understood from the following detailed description in conjunction with the accompanying drawings.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Figure 1:
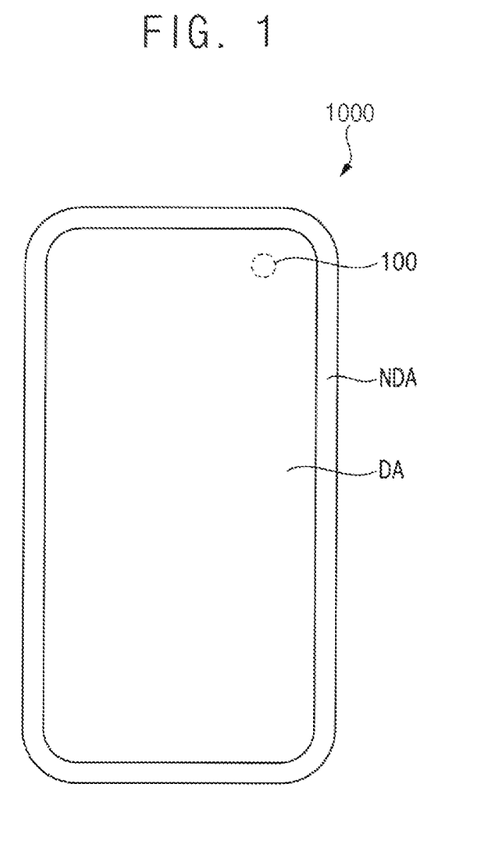
FIG. 1 is a schematic plan view illustrating a display device according to an embodiment.

FIG. 1 is a schematic plan view illustrating a display device according to an embodiment.

Referring to FIG. 1, a display device 1000 may include a display area DA and a non-display area NDA.

The display area DA may be an area in which an image is displayed on the display device 1000. The display device 1000 may include pixels in the display area DA. Each of the pixels may include a light emitting element. The light emitting element may emit light. For example, each of the pixels may receive an electrical signal from a circuit and emit light having a luminance corresponding to a level of the electrical signal from the circuit.

The non-display area NDA may be an area in which an image is not displayed on the display device 1000. The display device 1000 may include a circuit for driving the display device 1000 in the non-display area NDA. For example, the circuit may include a timing controller, a gate signal controller, and a data signal controller. The circuit may generate the electrical signal. For example, the electrical signal may include a gate signal, a data signal, and a driving signal. The circuit may be electrically connected to the pixels. Accordingly, the circuit may transmit the electrical signal to the pixels.

The display device 1000 may include a functional module 100. The functional module 100 may be disposed in the display area DA of the display device 1000. The functional module 100 may not be recognized by the user. For example, a part of the functional module 100 may overlap the pixels. Accordingly, an image may be displayed in an area overlapping the functional module 100 in the display area DA.

The functional module 100 may receive external light incident from an outside of the display device 1000. For example, the functional module 100 may include a camera that receives the external light and takes a picture or an image. For example, the functional module 100 may include a sensor that receives the external light and detects a user's motion (for example, a user's iris).

Figure 2:
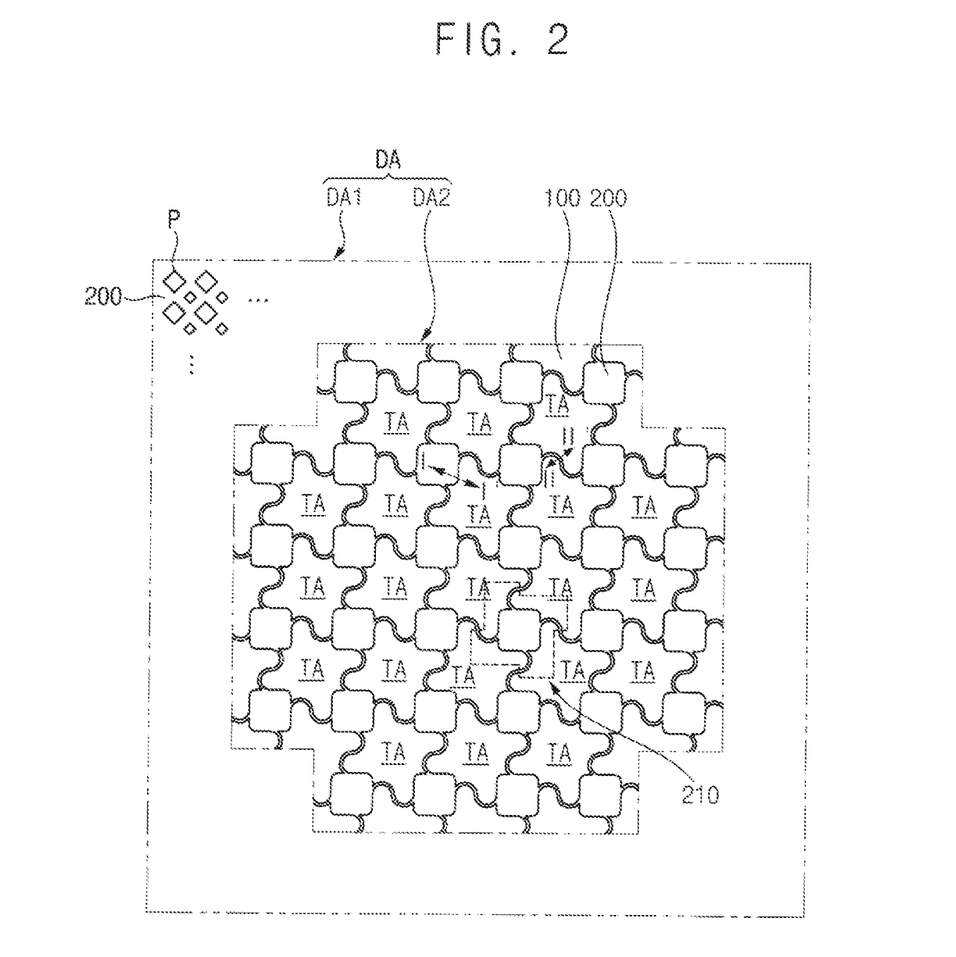
FIG. 2 is a schematic plan view illustrating a functional module and a light block layer included in the display device of FIG. 1.

FIG. 2 is a schematic plan view illustrating a functional module and a light block layer included in the display device of FIG. 1.

Referring to FIG. 1 and FIG. 2, the display area DA may include a first display area DA1 and a second display area DA2. The first display area DA1 may be an area in the display area DA where the functional module 100 does not exist. The second display area DA2 may be an area in the display area DA where the functional module 100 exists. For example, the functional module 100 may be disposed in the second display area DA2 of the display device 1000.

The display device 1000 may include first pixels P in the first display area DA1. Each of the first pixels P may emit light. For example, the first pixels P may include a red-pixel emitting red light, a green-pixel emitting green light, and a blue-pixel emitting blue light.

In the second display area DA2, a light block layer 200 may be disposed on the functional module 100. The light block layer 200 may block external light incident from an outside of the display device 1000. For example, the light block layer 200 may include a metal having a low light transmittance. The light block layer 200 may include patterns (or unit patterns) 210. For example, the unit patterns 210 may be arranged or disposed in a matrix form.

The light block layer 200 may overlap a part of the functional module 100. Accordingly, the second display area DA2 may include a transmission area TA as an area in the second display area DA2 in which the light block layer 200 does not exist. In the transmission area TA, the external light may be incident on the functional module 100.

Figure 3:
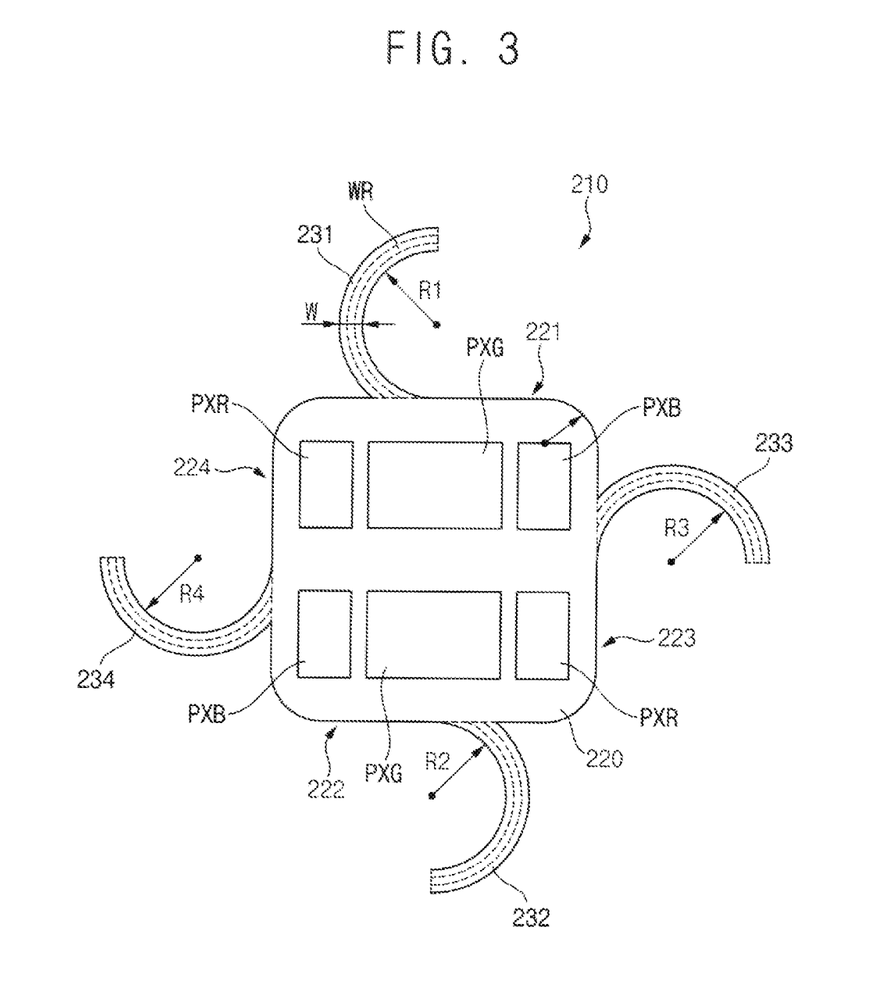
FIG. 3 is a schematic plan view illustrating an example of a unit pattern included in the light block layer of FIG. 2.
Figure 4:
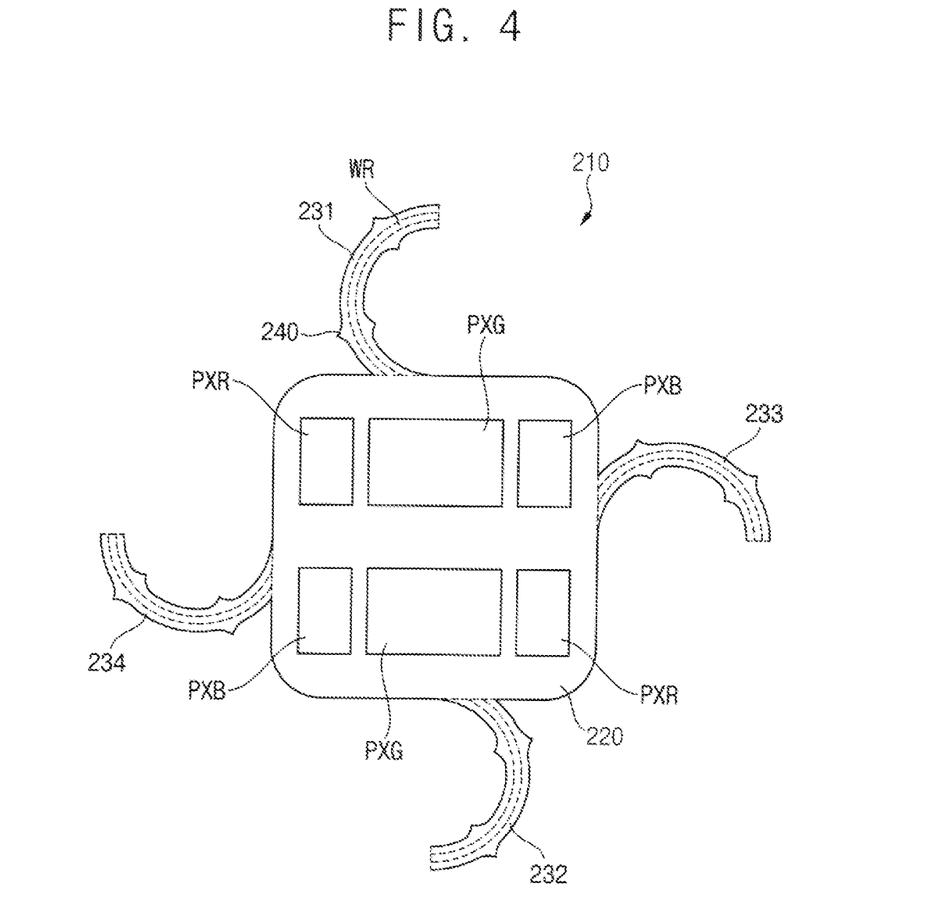
FIG. 4 is a schematic plan view illustrating an example of a unit pattern included in the light block layer of FIG. 2.

FIG. 3 is a schematic plan view illustrating an example of a unit pattern included in the light block layer of FIG. 2. FIG. 4 is a schematic plan view illustrating an example of a unit pattern included in the light block layer of FIG. 2.

Referring to FIG. 1, FIG. 2, and FIG. 3, the unit pattern 210 may include a main part 220 and line parts 231, 232, 233, and 234.

The main part 220 may have a substantially rectangular shape with substantially rounded corners. For example, the curvature radius R of the corner of the main part 220 may be about 15 μm or more and about 30 μm or less.

Second pixels PXR, PXB, and PXG may be disposed on the main part 220. The second pixels PXR, PXB, and PXG may receive an electrical signal, and emit light having a luminance corresponding to a level of the electrical signal. For example, a second red-pixel PXR emitting red light, a second green pixel PXG emitting green light, and a second blue-pixel PXB emitting blue light may be disposed on the main part 220. An arrangement of the second pixels PXR, PXB, and PXG illustrated in FIG. 3 is an example, and the second pixels PXR, PXB, and PXG may have various arrangements.

Since the second pixels PXR, PXB, and PXG emitting light are disposed on the main part 220, the display device 1000 may display an image in the second display area DA2.

Since the display device 100 includes the transmission area TA in the second display area DA2, the user may recognize a decrease in resolution of an image displayed on the display device 1000 in the second display area DA2. And, the user may visually recognize the functional module 100 in the second display area DA2. To prevent this, an emission area of the second pixels PXR, PXB, and PXG may be larger than an emission area of the first pixel P. Accordingly, the resolution of the second display area DA2 recognized by the user may be relatively high. Also, the functional module 100 may not be recognized by the user in the second display area DA2.

Each of the line parts 231, 232, 233, and 234 may be bent in a direction away from the main part 220. Since the line parts 231, 232, 233, and 234 have a substantially curved shape, a boundary of the transmission area TA may also have a substantially curved shape. Accordingly, a diffraction of external light incident to the functional module 100 through the transmission area TA may be relatively small.

A wiring WR electrically connected to the second pixels PXR, PXG, and PXB may be disposed on the line parts 231, 232, 233, and 234. The wiring WR may transmit the electrical signal to the second pixels PXR, PXG, and PXB. For example, the wiring WR may include at least one of a gate signal line, a data signal line, and a driving signal line.

In an embodiment, the line parts 231, 232, 233, and 234 may include a first line part 231 adjacent to a first side 221 of the main part 220, a second line part 232 adjacent to a second side 222 opposite to the first side 221 of the main part 220, a third line part 233 adjacent to a third side 223 positioned or disposed between the first side 221 and the second side 222 of the main part 220, and a fourth line part 234 adjacent to a fourth side 224 opposite to the third side 223 of the main part 220.

In an embodiment, a first curvature radius R1 of the first line part 231, a second curvature radius R2 of the second line part 232, a third curvature radius R3 of the third line part 233, and a fourth curvature radius R4 of the fourth line part 234 may be substantially the same or equal to each other. The first to fourth curvature radii R1, R2, R3, and R4 may mean an average curvature radius of inner sides of the first to fourth line parts 231, 232, 233, and 234.

In an embodiment, each of the first to fourth curvature radii R1, R2, R3, and R4 of the first to fourth line parts 231, 232, 233, and 234 may be about 25 μm or more and about 30 μm or less.

In an embodiment, widths W of each of the first to fourth line parts 231, 232, 233, and 234 may be substantially the same. The widths W of each of the first to fourth line parts 231, 232, 233, and 234 may be about 15 μm or more and about 30 μm or less.

Referring to FIG. 1, FIG. 2, and FIG. 4, each of the line parts 231, 232, 233, and 234 may further include a protrusion 240 on a side surface. The protrusion 240 may be formed on an inner surface and an outer surface of each of the line parts 231, 232, 233, and 234. A width of the protrusion 240 may become narrower as a distance from each of the line parts 231, 232, 233, and 234 increases. The protrusion 240 may allow the external light incident to the functional module 100 through the transmission area TA to be relatively less diffracted.

Figure 5:
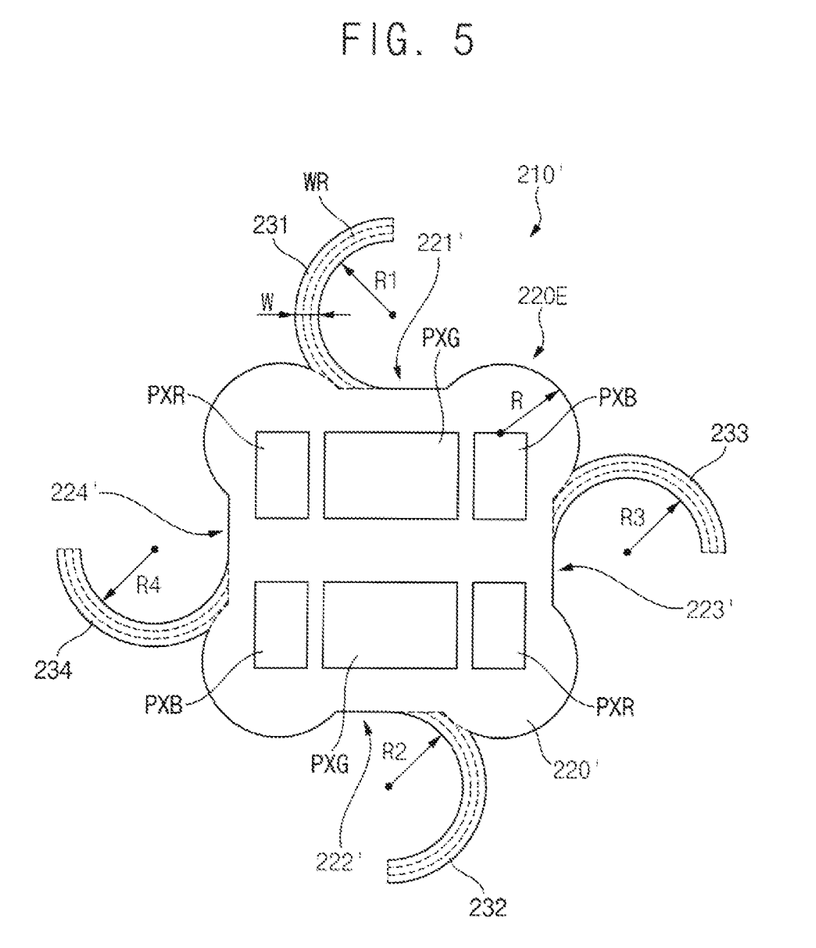
FIG. 5 is a schematic plan view illustrating another example of a unit pattern included in the light block layer of FIG. 2.
Figure 6:
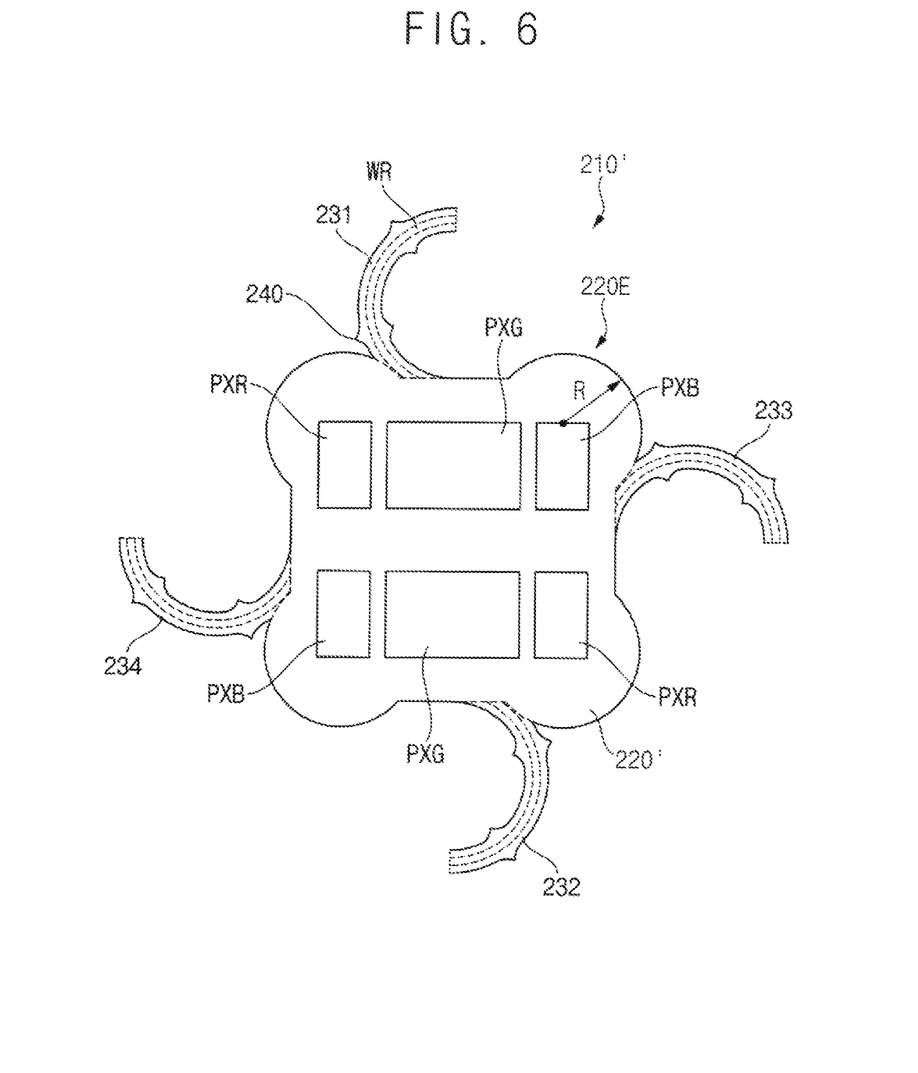
FIG. 6 is a schematic plan view illustrating another example of a unit pattern included in the light block layer of FIG. 2.

FIG. 5 is a schematic plan view illustrating another example of a unit pattern included in the light block layer of FIG. 2. FIG. 6 is a schematic plan view illustrating another example of a unit pattern included in the light block layer of FIG. 2.

Referring to FIG. 1, FIG. 2, and FIG. 5, a unit pattern 210' may include a main part 220' and line parts 231, 232, 233, and 234.

The main part 220' may have a substantially rectangular shape, and may include a substantially circular protrusion part 220E at corners of the substantially rectangular shape. A curvature radius R of the protrusion part 220E may be about 15 μm or more and about 30 μm or less.

Second pixels PXR, PXB, and PXG may be disposed on the main part 220'. The second pixels PXR, PXB, and PXG may receive an electrical signal, and emit light having a luminance corresponding to a level of the electrical signal. For example, a second red-pixel PXR emitting red light, a second green-pixel PXG emitting green light, and a second blue-pixel PXB emitting blue light may be disposed on the main part 220'.

Each of the line parts 231, 232, 233, and 234 may be bent in a direction away from the main part 220'. Since the line parts 231, 232, 233, and 234 have a substantially curved shape, a boundary of the transmission area TA may also have a substantially curved shape. Accordingly, a diffraction of external light incident to the functional module 100 through the transmission area TA may be relatively small.

A wiring WR electrically connected to the second pixels PXR, PXG, and PXB may be disposed on the line parts 231, 232, 233, and 234. The wiring WR may transmit the electrical signal to the second pixels PXR, PXG, and PXB. For example, the wiring WR may include at least one of a gate signal line, a data signal line, and a driving signal line.

In an embodiment, the line parts 231, 232, 233, and 234 may include a first line part 231 adjacent to a first side 221' of the main part 220', a second line part 231 adjacent to a second side 222' opposite to the first side 221' of the main part 220', a third line part 233 adjacent to a third side 223' positioned or disposed between the first side 221' and the second side 222' of the main part 220', and a fourth line part 234 adjacent to a fourth side 224' opposite to the third side 223' of the main part 220'.

In an embodiment, a first curvature radius R1 of the first line part 231, a second curvature radius R2 of the second line part 232, a third curvature radius R3 of the third line part 233, and a fourth curvature radius R4 of the fourth line part 234 may be substantially the same. The first to fourth curvature radii R1, R2, R3, and R4 may mean an average curvature radius of inner sides of the first to fourth line parts 231, 232, 233, and 234.

In an embodiment, each of the first to fourth curvature radii R1, R2, R3, and R4 of the first to fourth line parts 231, 232, 233, and 234 may be about 25 μm or more and 30 μm or less.

In an embodiment, widths W of each of the first to fourth line parts 231, 232, 233, and 234 may be substantially the same. The widths W of each of the first to fourth line parts 231, 232, 233, and 234 may be about 15 μm or more and about 30 μm or less.

Referring to FIG. 1, FIG. 2, and FIG. 6, each of the line parts 231, 232, 233, and 234 may further include a protrusion 240 on a side surface. The protrusion 240 may be formed on an inner surface and an outer surface of each of the line parts 231, 232, 233, and 234. A width of the protrusion 240 may become narrower as a distance from each of the line parts 231, 232, 233, and 234 increases. The protrusion 240 may allow the external light incident to the functional module 100 through the transmission area TA to be relatively less diffracted.

Figure 7:
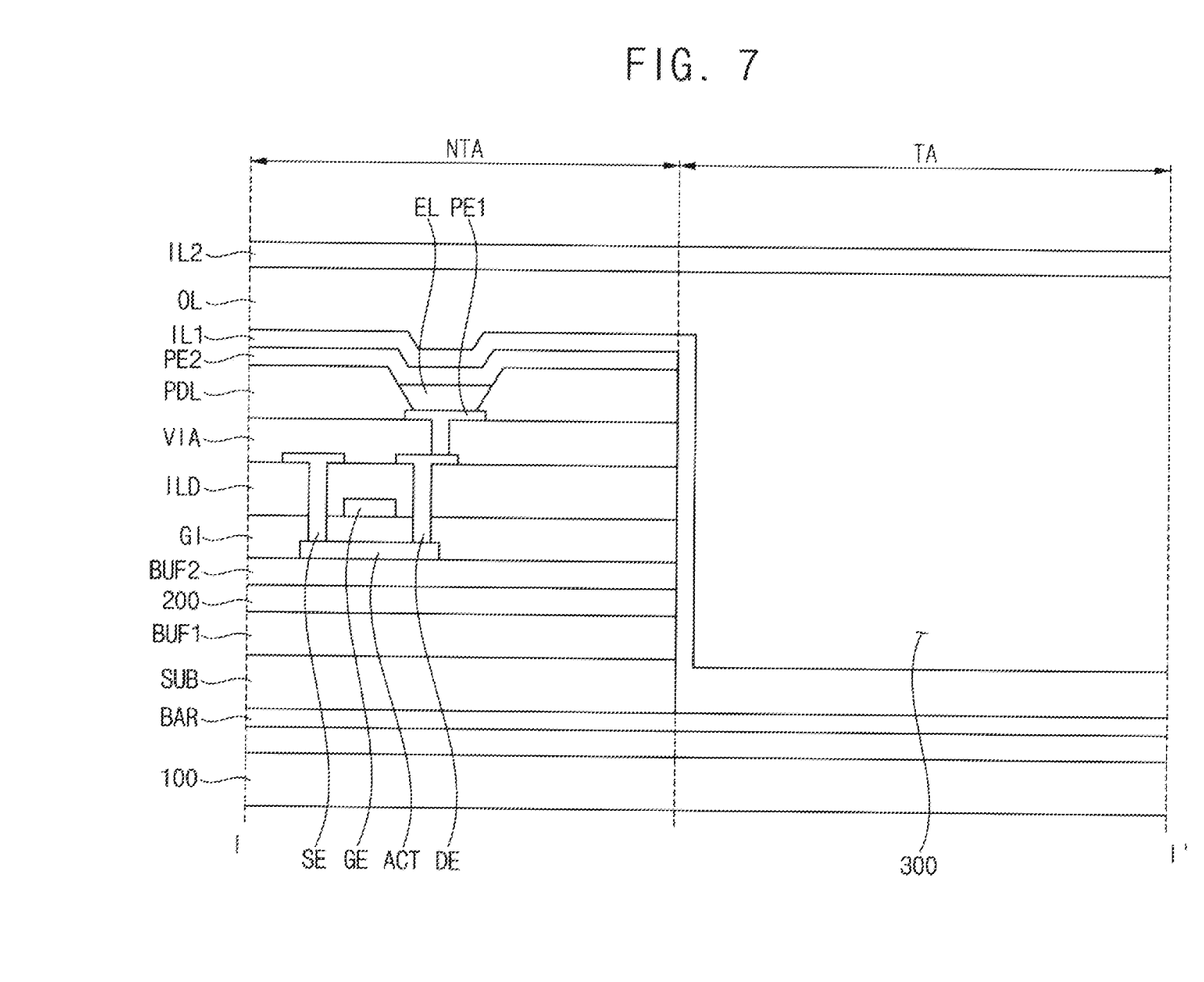
FIG. 7 is a schematic cross-sectional view taken along line I-I' of FIG. 2.

FIG. 7 is a schematic cross-sectional view taken along line I-I' of FIG. 2.

Referring to FIG. 1, FIG. 2, and FIG. 7, the display device 1000 may include the functional module 100, a barrier layer BAR, a substrate SUB, a first buffer layer BUF1, the light block layer 200, a second buffer layer BUF2, a gate insulating layer GI, an active pattern ACT, a source electrode SE, a drain electrode DE, a gate electrode GE, an interlayer insulating layer ILD, a via insulating layer VIA, a pixel defining layer PDL, a first electrode PE1, a light emission layer EL, a second electrode PE2, a first inorganic encapsulation layer IL1, an organic encapsulation layer OL, and a second inorganic encapsulation layer IL2. The transmission area TA may be an area through which external light incident from outside of the display device 1000 is transmitted, and a non-transmission area NTA may be an area through which the external light is not transmitted.

The barrier layer BAR may be disposed on the functional module 100 to be spaced apart from the functional module 100. The barrier layer BAR may prevent a penetration of impurities from the functional module 100. The barrier layer BAR may include silicon oxide, silicon nitride, silicon oxynitride, etc., within the spirit and the scope of the disclosure.

In the non-transmission area NTA, the substrate SUB may be disposed on the barrier layer BAR. The substrate SUB may include a glass material including silicon. However, a material of the substrate SUB is not limited thereto. For example, the substrate SUB may include plastic, polyethersulfone, polyacrylate, polyetherimide, polyarylate, polyimide, etc., within the spirit and the scope of the disclosure.

In the non-transmission area NTA, the first buffer layer BUF1 may be disposed on the substrate SUB. The first buffer layer BUF1 may prevent a penetration of impurities from the substrate SUB. The first buffer layer BUF1 may include silicon oxide, silicon nitride, silicon oxynitride, etc., within the spirit and the scope of the disclosure.

In the non-transmission area NTA, the light block layer 200 may be disposed on the first buffer layer BUF1. The light block layer 200 may include a material having a relatively low light transmittance. For example, the light block layer 200 may include a metal.

In the non-transmission area NTA, the second buffer layer BUF2 may be disposed on the light block layer 200. The second buffer layer BUF2 may prevent a penetration of impurities from the light block layer 200. The second buffer layer BUF2 may include silicon oxide, silicon nitride, silicon oxynitride, etc., within the spirit and the scope of the disclosure.

In the non-transmission area NTA, the active pattern ACT may be disposed on the second buffer layer BUF2. The active pattern ACT may include a semiconductor material. For example, the active pattern ACT may include a silicon-based semiconductor material. As an example, the active pattern ACT may include an oxide-based semiconductor material.

In the non-transmission area NTA, the gate insulating layer GI may be disposed on the second buffer layer BUF2. The gate insulating layer GI may cover or overlap the active pattern ACT. The gate insulating layer GI may electrically insulate the active pattern ACT from the gate electrode GE. The gate insulating layer GI may include an inorganic insulating material. For example, the gate insulating layer GI may include silicon oxide, silicon nitride, silicon oxynitride, etc., within the spirit and the scope of the disclosure.

In the non-transmission area NTA, the gate electrode GE may be disposed on the gate insulating layer GI. The gate electrode GE may overlap the active pattern ACT. The gate electrode GE may include a conductive material. For example, the gate electrode GE may include at least one of aluminum, platinum, palladium, silver, magnesium, gold, nickel, neodymium, iridium, chromium, lithium, calcium, molybdenum, titanium, tungsten, and copper. When an electrical signal is applied to the gate electrode GE, the source electrode SE and the drain electrode DE may be electrically connected.

In the non-transmission area NTA, the interlayer insulating layer ILD may be disposed on the gate insulating layer GI. The interlayer insulating layer ILD may cover or overlap the gate electrode GE. The interlayer insulating layer ILD may insulate the gate electrode GE from the source electrode SE. The interlayer insulating layer ILD may insulate the gate electrode GE from the drain electrode DE. The interlayer insulating layer ILD may include an inorganic insulating material. For example, the interlayer insulating layer ILD may include silicon oxide, silicon nitride, silicon oxynitride, etc., within the spirit and the scope of the disclosure.

In the non-transmission area NTA, the source electrode SE and the drain electrode DE may be disposed on the interlayer insulating layer ILD. The source electrode SE and the drain electrode DE may contact the active pattern ACT. For example, the source electrode SE may contact part of the active pattern ACT through a through hole penetrating the interlayer insulating layer ILD and the gate insulating layer GI. For example, the drain electrode DE may contact part of the active pattern ACT through a through hole penetrating the interlayer insulating layer ILD and the gate insulating layer GI. Each of the source electrode SE and the drain electrode DE may include a conductive material. For example, each of the source electrode SE and the drain electrode DE may include at least one of aluminum, platinum, palladium, silver, magnesium, gold, nickel, neodymium, iridium, chromium, lithium, calcium, molybdenum, titanium, tungsten, and copper.

In the non-transmission area NTA, the via insulating layer VIA may be disposed on the interlayer insulating layer ILD. The via insulating layer VIA may cover or overlap the source electrode SE and the drain electrode DE. An upper surface of the via insulating layer VIA may be a flat surface. The via insulating layer VIA may include an organic insulating material. For example, the via insulating layer VIA may include acrylic, benzocyclobutene (BCB), hexamethyldisiloxane (HMDSO), etc., within the spirit and the scope of the disclosure.

In the non-transmission area NTA, the first electrode PE1 may be disposed on the via insulating layer VIA. The first electrode PE1 may be electrically connected to the drain electrode DE. For example, the first electrode PE1 may electrically contact part of the drain electrode DE through a through hole penetrating the via insulating layer VIA. The first electrode PE1 may include a conductive material. For example, the first electrode PE1 may include at least one of ITO, IZO, IGO, AZO, and IGZO. As an example, the first electrode PE1 may include a same material or a similar material as the gate electrode GE.

In the non-transmission area NTA, the pixel defining layer PDL may be disposed on the via insulating layer VIA. The pixel defining layer PDL may cover or overlap at least a part of the first electrode PE1. The pixel defining layer PDL may define an opening exposing a part of the first electrode PE1.

In the non-transmission area NTA, the light emission layer EL may be disposed on the first electrode PE1. The light emission layer EL may further include at least one of a hole injection layer, a hole transport layer, an electron injection layer, and an electron transport layer. The light emission layer EL may emit light.

In the non-transmission area NTA, the second electrode PE2 may be disposed on the pixel defining layer PDL. The second electrode PE2 may cover or overlap the light emission layer EL. The second electrode PE2 may include a metal having a relatively low work function. For example, the second electrode PE2 may include at least one of lithium, calcium, aluminum, silver, and magnesium.

In the non-transmission area NTA, the active pattern ACT, the gate electrode GE, the source electrode SE, and the drain electrode DE may form a transistor. The light emission layer EL may be electrically connected to the transistor through the first electrode PE1. Accordingly, the emission layer EL may receive the electrical signal from the transistor, and emit light having a luminance corresponding a level of the electrical signal from the transistor.

In the non-transmission area NTA and the transmission area TA, the first inorganic encapsulation layer IL1 may be disposed. By way of example, in the non-transmission area NTA, the first inorganic encapsulation layer IL1 may be disposed on the second electrode PE1. In the transmission area TA, the first inorganic encapsulation layer IL1 may cover or overlap the side surface of the substrate SUB, the first buffer layer BUF1, the light block layer 200, the second buffer layer BUF2, the gate insulating layer GI, the interlayer insulating layer ILD, the via insulating layer VIA, the pixel defining layer PDL, and the second electrode PE2. In the transmission area TA, the first inorganic encapsulation layer IL1 may be disposed on the barrier layer BAR. The first inorganic encapsulation layer IL1 may include silicon oxide, silicon nitride, silicon oxynitride, etc., within the spirit and the scope of the disclosure.

In the non-transmission area NTA and the transmission area TA, the organic encapsulation layer OL may be disposed on the first inorganic encapsulation layer ILL Since the first inorganic encapsulation layer IL1 is formed along a lower structure, an upper surface of the first inorganic encapsulation layer IL1 may not be flat. An upper surface of the organic encapsulation layer OL may be a substantially flat surface. The organic encapsulation layer OL may include polyethylene terephthalate, polyethylene naphthalate, polycarbonate, polyimide, polyethylene sulfonate, polyoxymethylene, polyarylate, hexamethyldisiloxane, acrylic resin, etc., within the spirit and the scope of the disclosure.

In the non-transmission area NTA and the transmission area TA, the second inorganic encapsulation layer IL2 may be disposed on the organic encapsulation layer OL. The second inorganic encapsulation layer IL2 may include silicon oxide, silicon nitride, silicon oxynitride. The first inorganic encapsulation layer ILL the organic encapsulation layer OL, and the second inorganic encapsulation layer IL2 may prevent a penetration of impurities from outside of the display device 1000.

Figure 8:
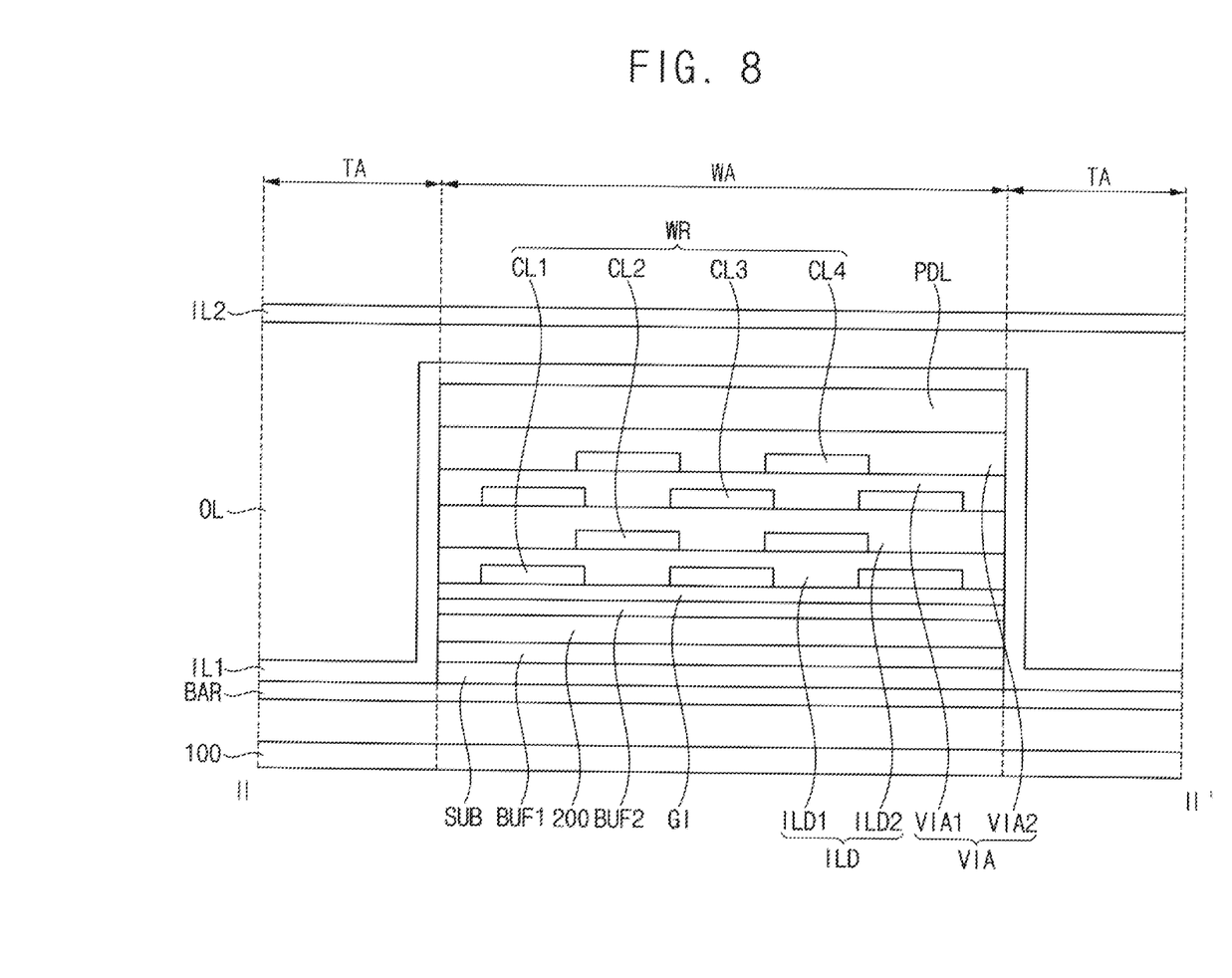
FIG. 8 is a schematic cross-sectional view taken along line II-II' of FIG. 2.

FIG. 8 is a schematic cross-sectional view taken along line II-II' of FIG. 2.

Referring to FIG. 1, FIG. 2, FIG. 7, and FIG. 8, the display device 1000 may include the functional module 100, the barrier layer BAR, the substrate SUB, the first buffer layer BUF1, the light block layer 200, the second buffer layer BUF2, the gate insulating layer GI, the interlayer insulating layer ILD, the via insulating layer VIA, a wiring WR, the pixel defining layer PDL, the first inorganic encapsulation layer IL1, the organic encapsulation layer OL, and the second inorganic encapsulation layer IL2. The interlayer insulating layer ILD may include a first interlayer insulating layer ILD1 and a second interlayer insulating layer ILD2. The via insulating layer VIA may include a first via insulating layer VIA1 and a second via insulating layer VIA2.

The wiring WR may include first to fourth conductive layers CL1, CL2, CL3, and CL4 sequentially stacked to be insulated from each other. The transmission area TA may be an area through which external light incident from the outside of the display device 1000 is transmitted, and a wiring area WA may be an area in which the wiring WR is disposed.

The barrier layer BAR may be disposed on the functional module 100 to be spaced apart from the functional module 100. The barrier layer BAR may prevent a penetration of impurities form the functional module 100.

In the wiring area WA, the first buffer layer BUF1, the light block layer 200, the second buffer layer BUF2, and the gate insulating layer GI may be sequentially stacked each other on the barrier layer BAR.

In the wiring area WA, the first conductive layer CL1 may be disposed on the gate insulating layer GI. The first conductive layer CL1 may include a conductive material. For example, the first conductive layer CL1 may include a metal or an alloy. The first conductive layer CL1 may be electrically connected to the source electrode SE, the drain electrode DE, the gate electrode GE, or the second electrode PE2.

In the wiring area WA, the first interlayer insulating layer ILD1 may be disposed on the gate insulating layer GI. The first interlayer insulating layer ILD1 may cover or overlap the first conductive layer CL1. The first interlayer insulating layer ILD1 may insulate the first conductive layer CL1 from the second conductive layer CL2.

In the wiring area WA, the second conductive layer CL2 may be disposed on the first interlayer insulating layer ILD1. The second conductive layer CL2 may include a conductive material. The second conductive layer CL2 may be electrically connected to the source electrode SE, the drain electrode DE, the gate electrode GE, or the second electrode PE2.

In the wiring area WA, the second interlayer insulating layer ILD2 may be disposed on the first interlayer insulating layer ILD1. The second interlayer insulating layer ILD2 may cover or overlap the second conductive layer CL2. The second interlayer insulating layer ILD2 may insulate the second conductive layer CL2 from the third conductive layer CL3.

In the wiring area WA, the third conductive layer CL3 may be disposed on the second interlayer insulating layer ILD2. The third conductive layer CL3 may include a conductive material. The third conductive layer CL3 may be electrically connected to the source electrode SE, the drain electrode DE, the gate electrode GE, or the second electrode PE2.

In the wiring area WA, the first via insulating layer VIA1 may be disposed on the second interlayer insulating layer ILD2. The first via insulating layer VIA1 may cover or overlap the third conductive layer CL3. The first via insulating layer VIA1 may insulate the third conductive layer CL3 from the fourth conductive layer CL4.

In the wiring area WA, the fourth conductive layer CL4 may be disposed on the first via insulating layer VIA1. The fourth conductive layer CL4 may include a conductive material. The fourth conductive layer CL4 may be electrically connected to the source electrode SE, the drain electrode DE, the gate electrode GE, or the second electrode PE2.

In the wiring area WA, the second via insulating layer VIA2 may be disposed on the first via insulating layer VIA1. The second via insulating layer VIA2 may cover or overlap the fourth conductive layer CL4.

In the wiring area WA, the pixel defining layer PDL may be disposed on the second via insulating layer VIA2.

In the wiring area WA and the transmission area TA, the first inorganic encapsulation layer IL1 may be disposed. By way of example, in the wiring area WA, the first inorganic encapsulation layer IL1 may be disposed on the pixel defining layer PDL. In the transmission area TA, the first inorganic encapsulation layer IL1 may cover or overlap side surfaces of the substrate SUB, the first buffer layer BUF1, the light block layer 200, the second buffer layer BUF2, the gate insulating layer GI, the interlayer insulating layer ILD, the via insulating layer VIA, and the pixel defining layer. In the transmission area TA, the first inorganic encapsulation layer IL1 may be disposed on the barrier layer BAR.

In the wiring area WA and the transmission area TA, the organic encapsulation layer OL may be disposed on the first inorganic encapsulation layer ILL Since the first inorganic encapsulation layer IL1 is formed along a lower structure, an upper surface of the first inorganic encapsulation layer IL1 may not be flat. An upper surface of the organic encapsulation layer OL may be substantially flat surface.

In the wiring area WA and the transmission area TA, the second inorganic encapsulation layer IL2 may be disposed on the organic encapsulation layer OL. The second inorganic encapsulation layer IL2 may include silicon oxide, silicon nitride, silicon oxynitride, etc., within the spirit and the scope of the disclosure. The first inorganic encapsulation layer ILL the organic encapsulation layer OL, and the second inorganic encapsulation layer IL2 may prevent penetration of impurities from outside of the display device 1000.

Figure 9:
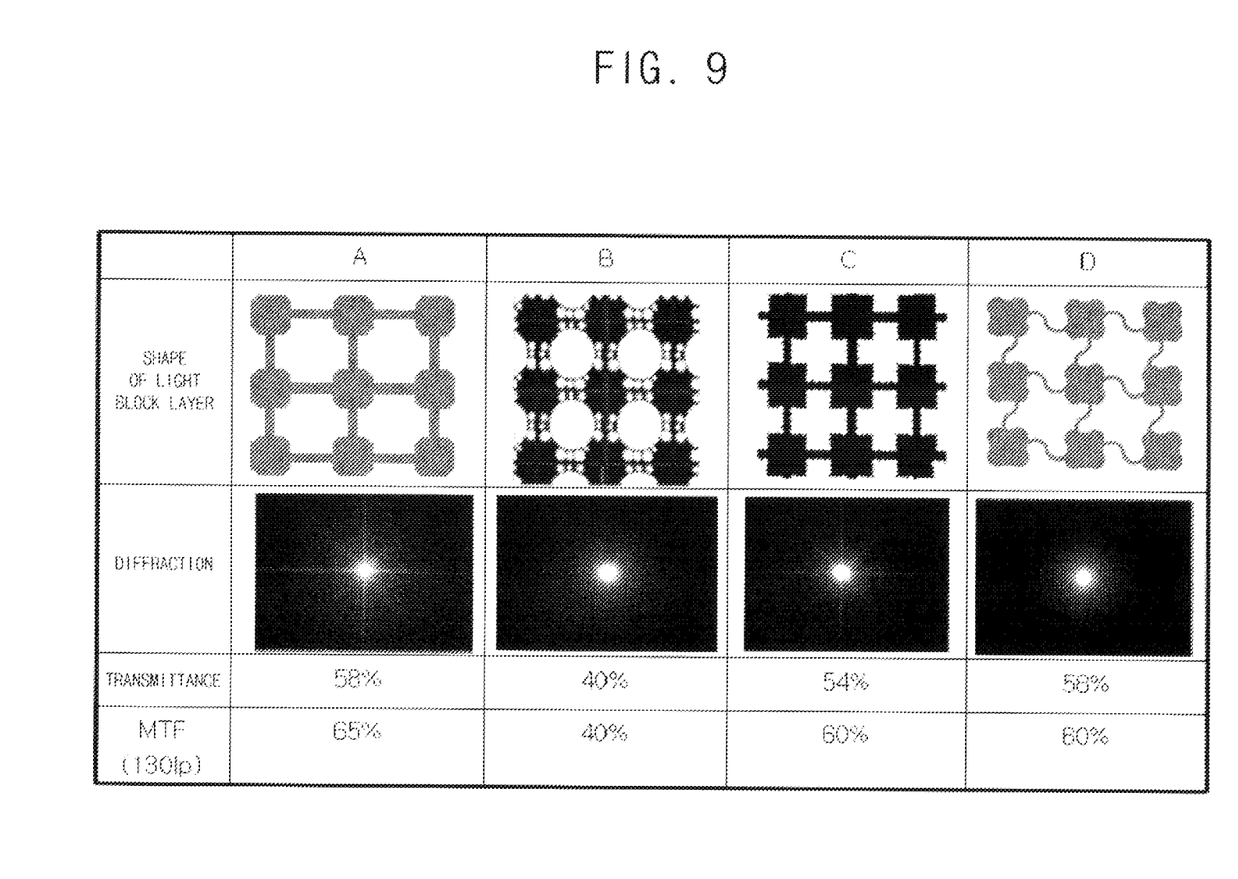
FIG. 9 is a table for explaining the display device of FIG. 2.

FIG. 9 is a table for explaining the display device of FIG. 2.

Referring to FIG. 2 and FIG. 9, the table of FIG. 9 shows experimental data by changing a shape of the light block layer 200 disposed on the functional module 100.

By way of example, in the table of FIG. 9, a diffraction of external light incident to the functional module 100 from the outside of the display device 1000 according to the shape of the light block layer 200 is shown as a photograph.

In the table of FIG. 9, in case that the light block layer 200 is not present, an amount of the external light incident to the functional module 100 is set to 100%. Accordingly, in the table of FIG. 9, an amount of the external light incident to the functional module 100 in case that the light block layer 200 is present is shown in the transmittance.

In the table of FIG. 9, in case that the light block layer 200 is not present, MTF (modulation transfer function) of the functional module 100 is set to 100%. Accordingly, in the table of FIG. 9, MTF of the functional module 100 in case that the light block layer 200 is present is shown.

In case that the light block layer 200 has the shape of Comparative Example A, transmittance is about 58%, and MTF is about 65%. In case that the light block layer 200 has the shape of Comparative Example A, transmittance and MTF may be relatively large. However, in case that the light block layer 200 has the shape of Comparative Example A, diffraction of the external light incident to the functional module 100 may occur relatively large. A performance of the functional module 100 may be deteriorated.

In case that the light bock layer 200 has the shape of Comparative Example B, transmittance is about 40%, and MTF is about 40%. In case that the light block layer 200 has the shape of Comparative Example B, diffraction of the external light incident to the functional module 100 may be relatively small. However, in case that the light block layer 200 has the shape of Comparative Example B, transmittance and MTF are relatively low, so that a performance of the functional module 100 may be deteriorated.

In case that the light block layer 200 has the shape of Comparative Example C, transmittance is about 54%, and MTF is about 60%. In case that the light block layer 200 has the shape of Comparative Example C, transmittance and MTF may be relatively large. However, in case that the light block layer 200 has the shape of Comparative Example C, diffraction of the external light incident to the functional module 100 may occur relatively large. In case that compared with Comparative Example A, diffraction of Comparative Example C is smaller than diffraction of Comparative Example A. However, in case that the light block layer 200 has the shape of Comparative Example C, diffraction of the external light is still relatively large, so that a performance of the functional module 100 may be deteriorated.

The shape of the light block layer 200 in Experimental Example D may be substantially the same as the shape of the light block layer 200 including the unit pattern 210' described with reference to FIG. 2 and FIG. 5. In case that the light block layer 200 has the shape of Experimental Example D, transmittance is about 58%, and MTF is about 60%. In case that the light block layer 200 has the shape of Experimental Example D, diffraction of the external light incident to the functional module 100 may occur relatively little. For example, in case that the light block layer 200 has the shape of Experimental Example D, transmittance and MTF may be relatively large, and diffraction of the external light incident to the functional module may occur relatively little.

Although embodiments and implementations have been described herein, other embodiments and modifications will be apparent from this description. Accordingly, the embodiments are not limited, but rather to the broader scope of the appended claims and various modifications and equivalent arrangements as would be apparent to a person of ordinary skill in the art.

What is claimed is:

1. A display device comprising:
    a substrate including a first display area and a second display area;
    first pixels disposed on the substrate in the first display area;
    a functional module disposed below the substrate in the second display area; and
    a light block layer disposed on the functional module, the light block layer including patterns disposed in a matrix in the second display area, wherein
    the second display area includes a transmission area as an area in the second display area not including the light block layer, and
    each of the patterns include:
        a main part having a substantially rectangular shape with substantially rounded corners; and
        line parts substantially curved away from the main part.

2. The display device of claim 1, wherein the line parts comprise:
    a first line part adjacent to a first side of the main part;
    a second line part adjacent to a second side opposite to the first side of the main part;
    a third line part adjacent to a third side disposed between the first side and the second side of the main part; and
    a fourth line part adjacent to a fourth side opposite to the third side of the main part.

3. The display device of claim 2, wherein a first curvature radius of the first line part, a second curvature radius of the second line part, a third curvature radius of the third line part, and a fourth curvature radius of the fourth line part are equal to each other.

4. The display device of claim 2, wherein each of a first curvature radius of the first line part, a second curvature radius of the second line part, a third curvature radius of the third line part, and a fourth curvature radius of the fourth line part is about 25 μm or more and about 30 μm or less.

5. The display device of claim 2, wherein each of a width of the first line part, a width of the second line part, a width of the third line part, and a width of the fourth line part is about 15 μm or more and about 30 μm or less.

6. The display device of claim 1, wherein each of the line parts comprises a protrusion on a side surface of the line parts.

7. The display device of claim 1, further comprising:
a second pixel disposed on the main part; and
a wiring disposed on the line part, the wiring is electrically connected to the second pixel.

8. The display device of claim 7, wherein the wiring includes at least one of a gate signal line, a data signal line, and a driving signal line.

9. The display device of claim 7, wherein
the wiring includes conductive layers sequentially stacked on the line parts, and
each of the conductive layers is electrically insulated from each other.

10. The display device of claim 1, wherein a curvature radius of the substantially rounded corners of the main part is about 15 μm or more and about 30 μm or less.

11. A display device comprising:
a substrate including a first display area and a second display area;
first pixels disposed on the substrate in the first display area;
a functional module disposed below the substrate in the second display area; and
a light block layer disposed on the functional module, the light block layer including patterns disposed in a matrix in the second display area, wherein
the second display area includes a transmission area as an area in the second display area not including the light block layer, and
each of the patterns include a main part having a substantially rectangular shape and including:
a substantially circular protrusion part at corners of the substantially rectangular shape; and
line parts substantially curved away from the main part.

12. The display device of claim 11, wherein the line parts comprise:
a first line part adjacent to a first side of the main part;
a second line part adjacent to a second side opposite to the first side of the main part;
a third line part adjacent to a third side disposed between the first side and the second side of the main part; and
a fourth line part adjacent to a fourth side opposite to the third side of the main part.

13. The display device of claim 12, wherein a first curvature radius of the first line part, a second curvature radius of the second line part, a third curvature radius of the third line part, and a fourth curvature radius of the fourth line part are equal to each other.

14. The display device of claim 12, wherein each of a first curvature radius of the first line part, a second curvature radius of the second line part, a third curvature radius of the third line part, and a fourth curvature radius of the fourth line part is about 25 μm or more and about 30 μm or less.

15. The display device of claim 12, wherein each of a width of the first line part, a width of the second line part, a width of the third line part, and a width of the fourth line part is about 15 μm or more and about 30 μm or less.

16. The display device of claim 11, wherein each of the line parts comprises a protrusion on a side surface of the line parts.

17. The display device of claim 11, further comprising:
a second pixel disposed on the main part; and
a wiring disposed on the line part, and electrically connected to the second pixel.

18. The display device of claim 17, wherein the wiring includes at least one of a gate signal line, a data signal line, and a driving signal line.

19. The display device of claim 17, wherein
the wiring includes conductive layers sequentially stacked on the line part, and
each of the conductive layers is electrically insulated from each other.

20. The display device of claim 11, wherein a curvature radius of the substantially circular protrusion part of the main part is about 15 μm or more and about 30 μm or less.

* * * * *